(12) United States Patent  
Rasmussen

(10) Patent No.: US 8,058,925 B2  
(45) Date of Patent: Nov. 15, 2011

(54) ADAPTIVE TEMPORAL FILTERING OF SINGLE EVENT EFFECTS

(75) Inventor: Brad J. Rasmussen, Rancho Palos Verdes, CA (US)

(73) Assignee: The Boeing Company, Chicago, IL (US)

( * ) Notice: Subject to any disclaimer, the term of this patent is extended or adjusted under 35 U.S.C. 154(b) by 144 days.

(21) Appl. No.: 12/429,638

(22) Filed: Apr. 24, 2009

(65) Prior Publication Data

US 2010/0271090 A1  Oct. 28, 2010

(51) Int. Cl.
*H03K 5/00* (2006.01)

(52) U.S. Cl. ........................ 327/551; 327/553
(58) Field of Classification Search ........... 327/551–559
See application file for complete search history.

(56) References Cited

U.S. PATENT DOCUMENTS

| 6,282,210 B1 * | 8/2001 | Rapport et al. ............... 370/518 |
| 6,456,138 B1 | 9/2002 | Yoder et al. |
| 7,388,407 B2 * | 6/2008 | Lin et al. ....................... 327/262 |

* cited by examiner

*Primary Examiner* — Dinh T. Le

(57) ABSTRACT

Technologies are described herein for mitigating the effects of single event effects or upsets on digital semiconductor device data paths and clocks utilizing an adaptive temporal filter. The adaptive temporal filter includes a master delay line and a slave delay line to generate two output clock signals that remain unaffected by variations in process, voltage and temperature (PVT) conditions. The adaptive temporal filter supplies the three independent clock signals having a programmable phase relationship, to a triple voting register structure for storing and outputting an uncorrupted data value using a majority voter.

12 Claims, 4 Drawing Sheets

ADAPTIVE TEMPORAL FILTERING OF SINGLE EVENT EFFECTS

GOVERNMENT RIGHTS

This invention was made with Government support under contract number FA8808-04-C-0022 awarded by the United States Air Force. The government has certain rights in this invention.

FIELD OF THE DISCLOSURE

The present disclosure relates generally to the field of filtering single event effects, and more particularly, to filtering single event effects using an adaptive temporal filtering system.

BACKGROUND

In space-based environments, ionic strikes by sub-atomic cosmic particles are known to introduce circuit disturbances in digital integrated circuits. These circuit disturbances are known as upsets or single event effects (SEE) and can be generally classified into three types: single event upsets (SEU), single event data path transients (Data SET), and single event transients of the clock distribution (Clock SET). These three types of SEEs are traditionally managed using different approaches. In conventional systems, stored logic values are typically protected from SEUs by using three storage elements, such as registers, to store redundant copies of the data. A majority voter is then used to output the correct data value, even if one of the storage elements gets corrupted. The use of the majority voter protects against an upset affecting any one of the three storage elements. However, if an upset strikes a data path, erroneous data from the data path may be stored in all three registers, thereby making the use of the majority voter futile. Further, if an upset strikes a clock signal, stored data or logic states may be inadvertently clocked and corrupted.

Existing methods to mitigate data SETs and clock SETs are applied independently. For instance, data SETs are typically mitigated by adding logic on the redundant register data inputs to filter any upsets that may affect the data path. However, the logic used for filtering these upsets must be set for a particular maximum upset pulse width. The logic used for the filter will vary with variations in process, voltage and temperature (PVT) conditions, causing either incomplete filtering or the need to set the filter for larger than desired pulse widths to compensate for variations in the PVT conditions. Filtering larger than necessary pulse widths adversely affects circuit performance and is therefore, undesirable. Moreover, these techniques do not mitigate Clock SETs.

Conventional techniques for mitigating Clock SETs include creating a custom clock splitter that incorporates logic to filter radiation upset pulses before passing the clock signal to a register. However, the clock-splitter structure is unique to a particular clock architecture and is not easily hosted on, or ported to various digital integrated circuit designs as it requires a non-standard, custom, cell design. Further, as a single pair of clock phases is fed to the storage elements, there remains some common output circuitry that may be subject to upsets and be affected by a clock SET at the storage elements.

It is with respect to these considerations and others that the disclosure made herein is presented.

SUMMARY

Technologies are described herein for mitigating the effects of radiation induced transient upsets on digital semiconductor device data paths and clocks using an adaptive temporal filter. According to one aspect of the disclosure, the adaptive temporal filter includes a master delay line that includes a plurality of master delay elements. The master delay line receives an input clock signal and determines the number of master delay elements used to offset the input clock signal by one full period. The master delay line then outputs a variable delay element count signal, which represents the number of master delay elements used to delay the input clock signal by one full period. Further, the adaptive temporal filter includes a data computation component that receives the variable delay element count signal from the master delay line and a desired offset signal representing a desired offset. The data computation component determines the number of slave delay elements to be used to delay the input clock signal by the desired offset and outputs a corresponding adaptive count signal. The adaptive temporal filter also includes a slave delay line that includes a plurality of slave delay elements. The slave delay line receives the adaptive count signal and the input clock signal, and further uses the number of slave delay elements represented by the adaptive count signal to delay the input clock signal by the desired offset to create an output clock signal. The slave delay line then outputs the output clock signal that is delayed relative to the input clock signal by the desired offset.

In another aspect, a method for mitigating radiation induced transient upset effects on digital semiconductor device data paths and clocks includes receiving an input clock signal at an adaptive temporal filter. The adaptive temporal filter then supplies the input clock signal to a master delay line, which includes master delay elements, as well as to a slave delay line, which includes slave delay elements. The master delay line creates a variable delay element count signal, which represents the number of master delay elements used to delay the input clock signal by one full period. Using the variable delay element count signal from the master delay line and a desired offset signal, which represents a desired offset, the adaptive temporal filter creates an adaptive count signal representing the number of slave delay elements to be used to delay the input clock signal by the desired offset. The input clock signal and the adaptive count signal are then received at the slave delay line and the input clock signal is delayed by using the number of slave delay elements represented by the adaptive count signal to create an output clock signal.

In yet another aspect, an adaptive temporal filter system includes an adaptive temporal filter that includes a first master delay line and a first slave delay line. The adaptive temporal filter is configured to utilize an input clock signal and a first computation component to create a first output clock signal that is delayed relative to the input clock signal by a first desired offset. The adaptive temporal filter also includes a second master delay line and a second slave delay line that creates a second output clock signal that is delayed relative to the input clock signal by a second desired offset. The adaptive temporal filter system also includes a triple voting register structure that receives the input clock signal, the first output clock signal and the second output clock signal from the adaptive temporal filter and a data input signal representing a data value to be stored in the triple voting register structure. The triple voting register structure stores the data value in the triple voting register structure once every full period of the input clock signal, the first output clock signal and the second output clock signal, and outputs the stored data value from a majority voter.

It should be appreciated that the above-described subject matter may also be implemented in various other embodiments without departing from the spirit of the disclosure. These and various other features will be apparent from a reading of the following Detailed Description and a review of the associated drawings.

This Summary is provided to introduce a selection of concepts in a simplified form that are further described below in the Detailed Description. This Summary is not intended to identify key features or essential features of the claimed subject matter, nor is it intended that this Summary be used to limit the scope of the claimed subject matter. Furthermore, the claimed subject matter is not limited to implementations that solve any or all disadvantages noted in any part of this disclosure.

DETAILED DESCRIPTION

Figure 1:
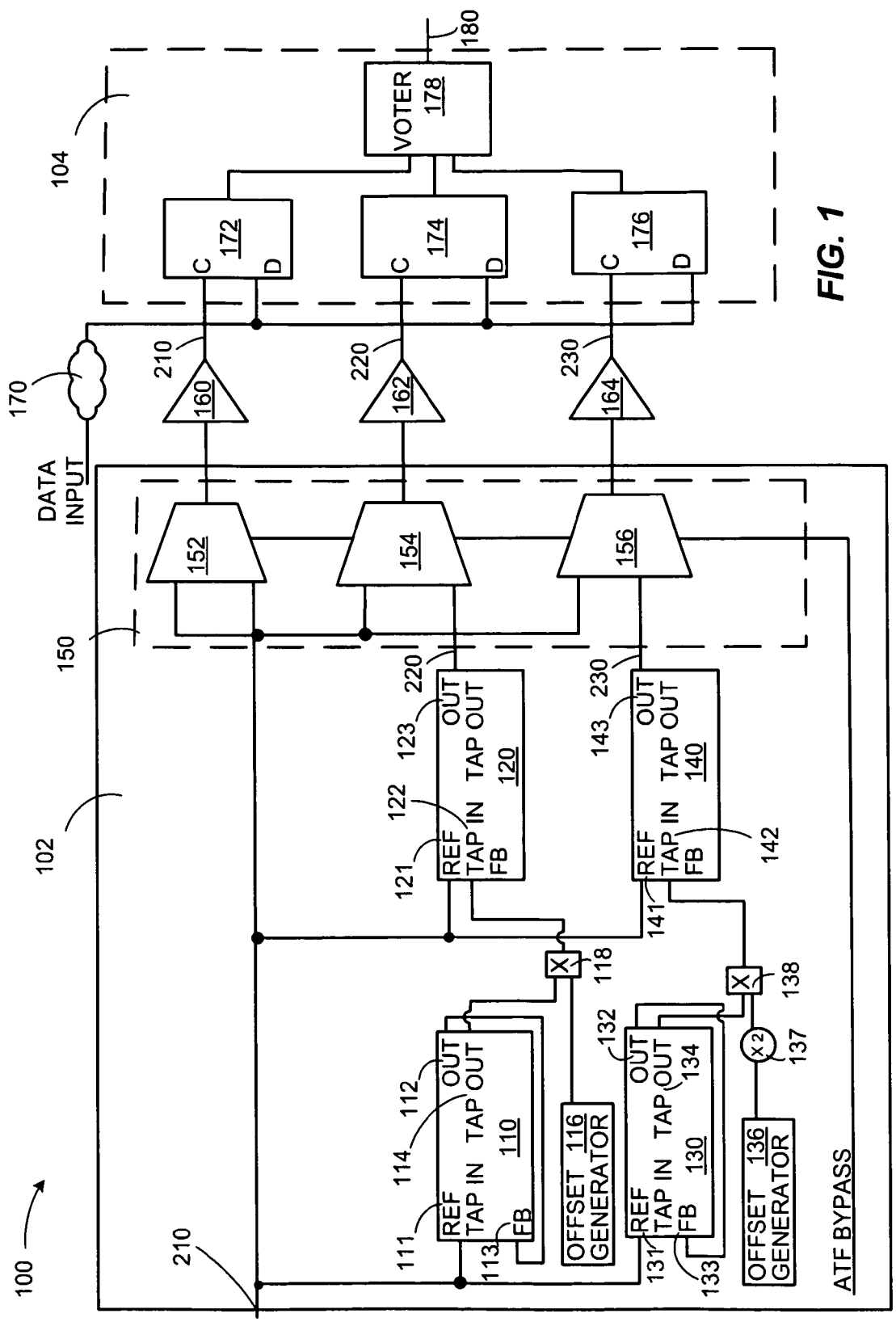
FIG. 1 is an integrated circuit architecture illustrating an adaptive temporal filter for mitigating the effect of single event effects on a digital integrated circuit, according to embodiments described herein.

The following detailed description is directed to technologies for mitigating the effects of radiation induced circuit disturbances, such as SEUs, Data SETs and Clock SETs on digital semiconductor storage elements, data paths and clock paths, respectively.

Generally, the various embodiments of the present disclosure describe an adaptive temporal filter system that is configured to mitigate the effects, caused by all upsets having a pulse width not larger than a target pulse width, on an integrated circuit. The adaptive temporal filter system includes an adaptive temporal filter configured to receive an input clock signal and to generate three independent clock signals that are precisely offset relative to one another by a desired offset. The desired offset may be a target pulse width corresponding to the pulse widths of transient upsets for a given semiconductor technology commonly found in various conditions of a space environment. Setting a large offset may adversely affect circuit performance; therefore it may be beneficial to use a balancing scale standard to balance circuit performance against the risk of an upset impacting the integrated circuit. In various embodiments, the desired offset is set as the maximum pulse width of upsets that are desired to be filtered.

Unlike existing technologies, various embodiments of the adaptive temporal filter system described herein are intended to mitigate the effects of Clock SETs, Data SETs and SEUs in a single configuration. The adaptive temporal filter system utilizes the adaptive temporal filter to mitigate the effects of Clock SETs by generating three independent clock signals having signal generation paths and components that are isolated from each other. Further, the adaptive temporal filter system utilizes a triple voting register structure to mitigate the effects of Data SETs on a data input signal, by allowing a data input signal to be stored in each of the three storage elements of the triple voting register only when the independent clock signals approaches their respective trigger points, which in one embodiment may be the rising edge of a clock signal. Because the independent clock signals are delayed by the desired offset, any upset not larger than the desired offset may only be stored in one of the three storage registers, per full period. Further, the triple voting register structure includes the majority voter to output the majority data value, which is uncorrupted, even though one of the three storage elements may be affected by an SEU.

In the following detailed description, references are made to the accompanying drawings that form a part hereof, and that show, by way of illustration, specific embodiments or examples. Referring now to the drawings, in which like numerals represent like elements through the several figures, aspects of an adaptive temporal filter system for mitigating the effects of an upset on a digital integrated circuit will be described.

Figure 2:
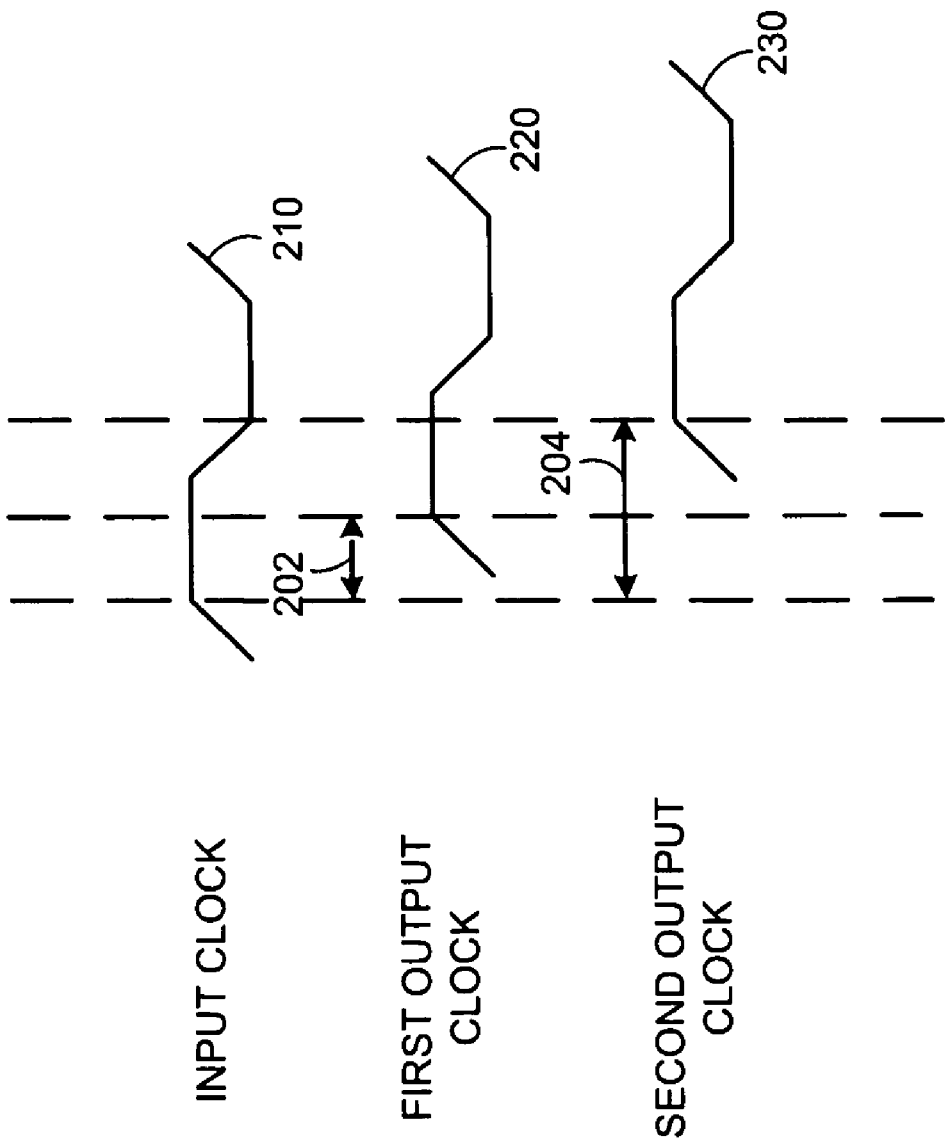
FIG. 2 is a graphical representation of a first clock output signal, a second clock output signal offset from the first clock output signal by a desired maximum pulse width and a third clock output signal offset from the second clock output signal by the desired maximum pulse width, according to embodiments described herein.

FIG. 1 illustrates an adaptive temporal filter system 100 that is configured to mitigate radiation induced transient upset effects on digital semiconductor device data paths and clocks. The adaptive temporal filter system 100 includes an adaptive temporal filter 102 and a triple voting register structure 104. The adaptive temporal filter 102 is configured to receive an input clock signal 210 and further configured to output the input clock signal 210, a first output clock signal 220 and a second output clock signal 230. As shown in FIG. 2, the first output clock signal 220 is offset from the input clock signal 210 by a desired offset 202 that may be programmed to be the maximum pulse width of an upset desired to be filtered. The second output clock signal 230 may be offset from the first output clock signal 220 by the same desired offset, such that the second output clock signal 230 is offset from the input clock signal 210 by a second desired offset 204, which is twice the desired offset 202.

Returning to FIG. 1, the adaptive temporal filter 102 may include four delay lines: a first master digital delay line, which may be a digital locked loop (first DLL) 110; a first slave delay line (first SDL) 120; a second master delay line, which like the first master delay line, may be a digital locked loop (second DLL) 130; and a second slave delay line (second SDL) 140. The first DLL 110 and the second DLL 130 each include a plurality of master delay elements (not shown), and the first SDL and second SDL each include a plurality of slave delay elements (not shown). Each master and slave delay element is configured to delay a clock signal by a finite amount of time, known as the delay length. In various embodiments, the delay length of each delay element in a master delay line or a slave delay line is approximately the same. For instance, in one embodiment, the first DLL 110, the first SDL 120, the second DLL 130 and the second SDL 140 are all identical finite state machines having the same number of identical delay elements. It should be appreciated that the delay length of each delay element may vary under varying PVT conditions, therefore the number of delay elements that are used to delay a clock signal by one full period may vary under varying PVT conditions.

As previously stated, each of the DLLs 110, 130 and SDLs 120, 140 may be identical components according to various embodiments. However, depending on how the components are configured, they may each perform different functions. For instance, using the first DLL 110 as an example for the DLLs, the first DLL 110 utilizes a reference input 111, a feedback input 113, the output 112 and the tap output 114. On the other hand, using the first SDL 120 as an example for the SDLs, the first SDL 120 utilizes a reference input 121, the tap input 122, and the output 123.

The first DLL 110 is configured to receive the input clock signal 210 at reference input 111 and output a first delay element count signal at the tap output 114. The first delay element count signal represents the number of master delay elements used to offset the input clock signal 210 by one full period. Upon receiving the input clock signal 210, the first DLL 110 generates a first feedback clock signal at the output 112, from where the first feedback clock signal is looped back into the first DLL 110 via the feedback input 113. The first feedback clock signal represents a clock signal that is offset from the input clock signal 210 by an adjustable phase delay that varies depending on the number of delay elements used. By looping the first feedback clock signal back into the first DLL 110 and using the input clock signal 210 as a reference, the first DLL 110 may adjust the number of delay elements being used until the first feedback clock signal is offset relative to the input clock signal 210 by one full period.

In various embodiments of the present disclosure, the number of delay elements used to delay the first feedback clock signal may be adjusted using a reiterative process. The reiterative process allows the first DLL 110 to adjust the number of delay elements used to delay the first feedback clock signal, until the feedback clock signal is delayed from the input clock signal 210 by one full period. Upon generating a feedback clock signal that is offset by one full period, the first DLL 110 "locks" the number of delay elements being used, and outputs the first delay element count signal from the tap output 114. The delay element count signal remains locked until changes in the PVT conditions of the DLL alter the feedback clock signal, such that it is no longer delayed by one full period. In one embodiment, the DLL incorporates a phase detector to determine if the feedback clock is in phase with the reference clock. Additionally, this phase detector also indicates whether additional delay elements are required or if delay elements must be removed. The DLL begins operation with minimal delay inserted, so the phase detector will indicate additional delay is required. Additional delay elements are added in until the phase detector toggles from indicating addition delay is required to indicating too much delay has been added. At this point, one delay element is removed and the phase detector would toggle back to indicating additional delay elements are required. It is this specific set of phase detector transitions that defines the locked condition. The delay line is then allowed to jitter between adding one element and taking one out and watching the phase detector response. Should the phase detector response differ from this toggling operation, the delay line is no longer locked, and the delay line readjusts until this toggling response is observed again.

Under varying PVT conditions, the first DLL 110 may have to re-determine the number of master delay elements required to delay the first feedback clock signal from the input clock signal 210 by one full period under different PVT conditions. Once the new delay element count signal is determined, the first DLL 110 may re-lock the new first delay element count signal. Generally, a master DLL, such as the first DLL 110, may be configured to output a delay element count signal that represents the number of delay elements used to offset the input clock signal by one full period at the tap output 114. The ability of the master DLL to continuously alter the delay element count signal under varying PVT conditions makes the adaptive temporal filter system 100 adaptive.

The adaptive temporal filter 102 further includes a first offset signal generator 116 and a first data computation component 118. In various embodiments of the present disclosure, the first offset signal generator 116 and the first data computation component 118 may be any type of electrical component, which may include circuitry to perform a variety of operations, such as logic, arithmetic and signal generation operations. The first offset signal generator 116 may be configured to generate a first desired offset signal that represents the desired offset 202, as described above. The first offset signal generator 116 supplies the first desired offset signal to the first data computation component 118, which receives the first desired offset signal and the first delay element count signal from the first DLL 110. The first data computation component 118 performs logical and/or arithmetical operations on data values represented by the first delay element count signal and the desired offset signal to determine the number of slave delay elements used to delay the input clock signal 210 by the desired offset 202. This number of slave delay elements is represented by the first adaptive count signal, which is output by the first data computation component 118.

By way of example and not limitation, if the desired offset 202 is 2 ns, the input clock signal 210 has a frequency of 100 MHz and a corresponding clock period of 10 ns, and the first DLL 110 generates a delay element count signal that represents 100 elements at the tap output 114, then each delay element has a delay length of 0.1 ns. Now, if all upsets having a pulse width of 2 ns or smaller are desired to be filtered, the desired offset is set at 2 ns. In order to determine the number of delay elements used to offset the clock signal by 2 ns, the desired offset 202 is divided by the delay length of each delay element, which is 20 delay elements. In another embodiment, the first desired offset signal may represent a value that is equal to the desired offset 202 over the period of input clock signal 210, in which case, the first desired offset signal may represent a value of 0.2 and the first data computation component may be configured to multiply the delay element count signal and the first desired offset signal to determine the number of slave delay elements required to offset the input clock signal.

As described above, the first SDL 120 may have a similar structure to the first DLL 110 but may be configured differently to perform a different function. The first SDL 120 is configured to receive the input clock signal 210 at the reference input 121 and the first adaptive count signal at tap input 122 from the first data computation component 118. The first SDL 120 is configured to offset the input clock signal 210 by the desired offset 202, by utilizing the number of delay elements represented by the adaptive count signal. The first SDL 120 is further configured to generate the first output clock signal 220 at the output 123, where the first output clock signal 220 is delayed relative to the input clock signal 210 by the desired offset 202.

It may be appreciated that using an SDL that includes delay elements that have a delay length that is different from the delay lengths of the delay elements in the master DLL may produce clock signals that have offsets that are different from the desired offsets. Therefore, using similar components for a DLL and the SDL may greatly improve the chances of generating a clock signal that is precisely offset from the input clock signal by the desired offset.

The second DLL 130 and the second SDL 140 are configured to operate in a manner similar to that of the first DLL 110 and first SDL 120 in order to create a second output clock signal 230 that is offset twice as much, or any other desired amount, as the first output clock signal 220 from the input clock signal 210. The second DLL 130 is configured to receive the input clock signal 210 at a reference input 131 and further configured to generate a second delay element count signal at the tap output 134, where the second delay element count signal, like the first delay element count signal, represents the number of delay elements required to delay the input clock signal 210 by one full period. Upon receiving the input clock signal 210, the second DLL 130 generates a second feedback clock signal at the output 132, from where the second feedback clock signal is looped back into the second DLL 130 via the feedback input 133.

Similar to the first feedback clock signal, the second feedback clock signal represents a clock signal that is offset from the input clock signal 210 by an adjustable phase delay that varies depending on the number of delay elements used. By looping the second feedback clock signal back into the second DLL 130 and using the input clock signal 210 as a reference, the second DLL 130 may adjust the number of delay elements being used until the second feedback clock signal is offset relative to the input clock signal 210 by one full period. As discussed above, the number of delay elements used to delay the second feedback clock signal may be adjusted using a reiterative process. The reiterative process allows the second DLL 130 to adjust the number of delay elements used to delay the second feedback clock signal, until the feedback clock signal is delayed from the input clock signal 210 by one full period. Upon generating a second feedback clock signal that is offset relative to the input clock signal by one full period, the second DLL 130 "locks" the number of delay elements being used, and outputs the second delay element count signal from the tap output 134. The delay element count signal remains locked until changes in the PVT conditions of the DLL alter the feedback clock signal, such that it is no longer offset by one full period.

The adaptive temporal filter 102 further includes a second desired offset signal generator 136 configured to generate a second desired offset signal, which may be twice the first desired offset signal, and which represents a second desired offset 204, as illustrated in FIG. 2. As described above, the second desired offset signal generator may be any electrical component that may include circuitry configured to perform signal generation operations. In one embodiment, the second desired offset signal generator 136 generates a second desired offset that is equal to the first desired offset signal. The second desired offset signal generator 136 may supply this second desired offset signal to logic circuitry 137 included in the adaptive temporal filter 102, that converts the second desired offset signal to represent a second desired offset 204 that is twice the first desired offset 202.

The adaptive temporal filter 102 further includes a second data computation component 138, configured to receive the second delay element count signal and the second desired offset signal. The second data computation component 138 generates a second adaptive count signal, which represents the number of delay elements required to offset a clock signal by the second desired offset 204. As described above, the second data computation component 138 may be any electrical component that may include circuitry configured to perform at least one of a variety of functions, such as logic, arithmetic and signal generation operations.

The second SDL 140 operates similar to the first SDL 120 and is configured to receive the input clock signal 210 at a reference input 141 and the second adaptive count signal at a tap input 142. The second SDL 140 generates a second output clock signal 230 at the output 143, where the second output clock signal 230 is offset relative to the input clock signal 210 by the second desired offset 204.

In one embodiment, only one of the first and second master DLLs 110, 130 may provide a delay element count signal to both the first and second data computation components 118, 138. This may be undesirable because an SEE upset in the master DLL would affect two clock signals, overwhelming the triple voting register structure 104. Therefore, having two separate master DLLs allows the clock signals to have independent clock signal generation paths, reducing the risk of an upset affecting more than one clock signal.

In various embodiments of the present disclosure, the adaptive temporal filter 102 may also include a multiplexer 150 that is controlled by an adaptive temporal filter bypass signal that may allow the adaptive temporal filter 102 to supply the input clock signal 210 to a first clock tree 160, a second clock tree 162 and a third clock tree 164, respectively, upon receiving the adaptive temporal filter bypass signal controlling the multiplexer 150 to bypass the input clock signal 210. The multiplexer 150 includes a first logic gate 152 that receives the input clock signal 210 and supplies the input clock signal 210 to the first clock tree 160. The multiplexer 150 also includes a second logic gate 154 that receives the input clock signal 210 and the first output clock signal 220 from the first SDL 120 and supplies the first output clock signal 220 to the second clock tree 162, as long as the multiplexer 150 does not bypass the output clock signal from the first SDL 120. The multiplexer 150 also includes a third logic gate 156 that receives the input clock signal 210 and the second output clock signal 230 from the second SDL 140. The third logic gate 156 supplies the second output clock signal 230 to a third clock tree 164, as long as the multiplexer 150 does not bypass the second output clock signal 230 from the second SDL 140. It should also be noted that the first logic gate 152 may keep the three clock paths evenly balanced in phase, matching the logic gates 154 and 156 in the offset clock paths.

The first clock tree 160, the second clock tree 162 and the third clock tree 164 are a part of the adaptive temporal filter system 100. The first clock tree 160 is configured to receive the input clock signal 210, the second clock tree 162 is configured to receive the first output clock signal 220 and the third clock tree 164 is configured to receive the second output clock signal 230 from the adaptive temporal filter 102. It should be appreciated that the delay through these three clock trees 160, 162 and 164 be latency balanced as to maintain the phase offset established by the adaptive temporal filter 102.

The adaptive temporal filter system 100 further includes the triple voting register structure 104, which includes a first storage element 172, a second storage element 174, a third storage element 176 and a majority voter 178. The triple voting register structure 104 is configured to receive a data input signal 170, the input clock signal 210, the first output clock signal 220 and the second output clock signal 230, and is further configured to output a majority data value from the majority voter 178. The majority data value represents the data value stored in at least two of the three storage elements of the triple voting register structure 104. Therefore, as long as two of the three storage elements store a correct data value, the majority voter 178 will output the correct data value at the output 180.

The first, second and third storage elements 172, 174, 176 are each configured to receive the data input signal 170 containing a data value to be stored, which is susceptible to strikes from Data SETs. The first storage element 172 receives the input clock signal 210 from the first clock tree 160 and the data input signal 170 and may only store the data value once per full period of the input clock signal 210. Similar to the first storage element 172, the second storage element 174 receives the data input signal 170 and the first output clock signal 220 from the second clock tree 162 and also stores the data value only once per full period of the first output clock signal 220. Likewise, the third storage element 176 receives the second output clock signal 230 from the third clock tree 164 and the data input signal 170 and only stores the data value only once per full period of the third output clock signal 230. It should be appreciated that components within the adaptive temporal filter system may include internal delay elements that may cause the clock signals to be delayed. For instance, it should be appreciated that the clock signal being supplied to the triple voting register structure 104 may be out of phase from the input clock signal 210 due to the delays inserted by some of the components, such as the first logic gate 152 and the first clock tree 160. In the interest of clarity in the present disclosure, any delays caused by the internal delay elements in the components may be ignored. It should be appreciated that such delays are within the scope of the present disclosure and various embodiments may include strategies to overcome any adverse performance resulting from such delays. For example, in various embodiments, these delays may be incorporated in the design such that the adaptive temporal filter system 102 continues to perform in a desired manner. Additionally, the components may be latency balanced in an effort to overcome these delays.

In various embodiments, the data value is stored in each of the first, second and third storage elements 172, 174, 176 when the associated clock signal 210, 220, 230 approaches its trigger point, such as the rising edge of the clock signal. The rising edge of a clock signal may be when the clock signal changes from a low state to a high state. It should be appreciated that because the first output clock signal 220 and the second output clock signal 230 are delayed relative to the input clock signal 210, only one of the three clock signals may approach its trigger point at any given time. In alternative embodiments, the storage elements may store the data value at any other pre-defined trigger point in the associated clock. Further, because the clock signals are offset by the maximum pulse width of an upset desired to be filtered, any upset that has a maximum pulse width not larger than the desired offset may only affect the data value stored in only one of the three storage elements 172, 174, 176. A data valid window is the small period of time around the clock trigger point that the data must be stable to be properly sampled into a storage element. The required data stable time that precedes the clock trigger point is commonly referred to as the setup time, and the required data stable time that follows the clock trigger point is referred to as the hold time. Any data transitions during this window will result in ambiguous sampling into the storage element. It should be appreciated that a Data SET with a pulse width less than the desired clock offset could only cause these undesired transitions within this data valid window for only one of the three redundant storage elements. In various embodiments, the desired clock offset may be set to a value that is the size of the data valid window plus the data SET pulse width to be filtered. In one embodiment, where the data valid window has a zero setup time and zero hold time, the offset may be set to the maximum Data SET pulse width desired to be filtered.

Each of the first, second and third storage elements 172, 174, 176 supplies the stored data value to the majority voter 178, which is configured to output the majority data value. Therefore, even if one of the storage elements stored an incorrect data value, the other two of the three storage elements will have the correct data value stored and the majority voter 178 will output the correct, majority data value at the output 180. Using the three storage elements and majority voting their outputs mitigates against SEUs occurring in the storage elements themselves in addition to filtering the Data SET as described above.

Figure 3:
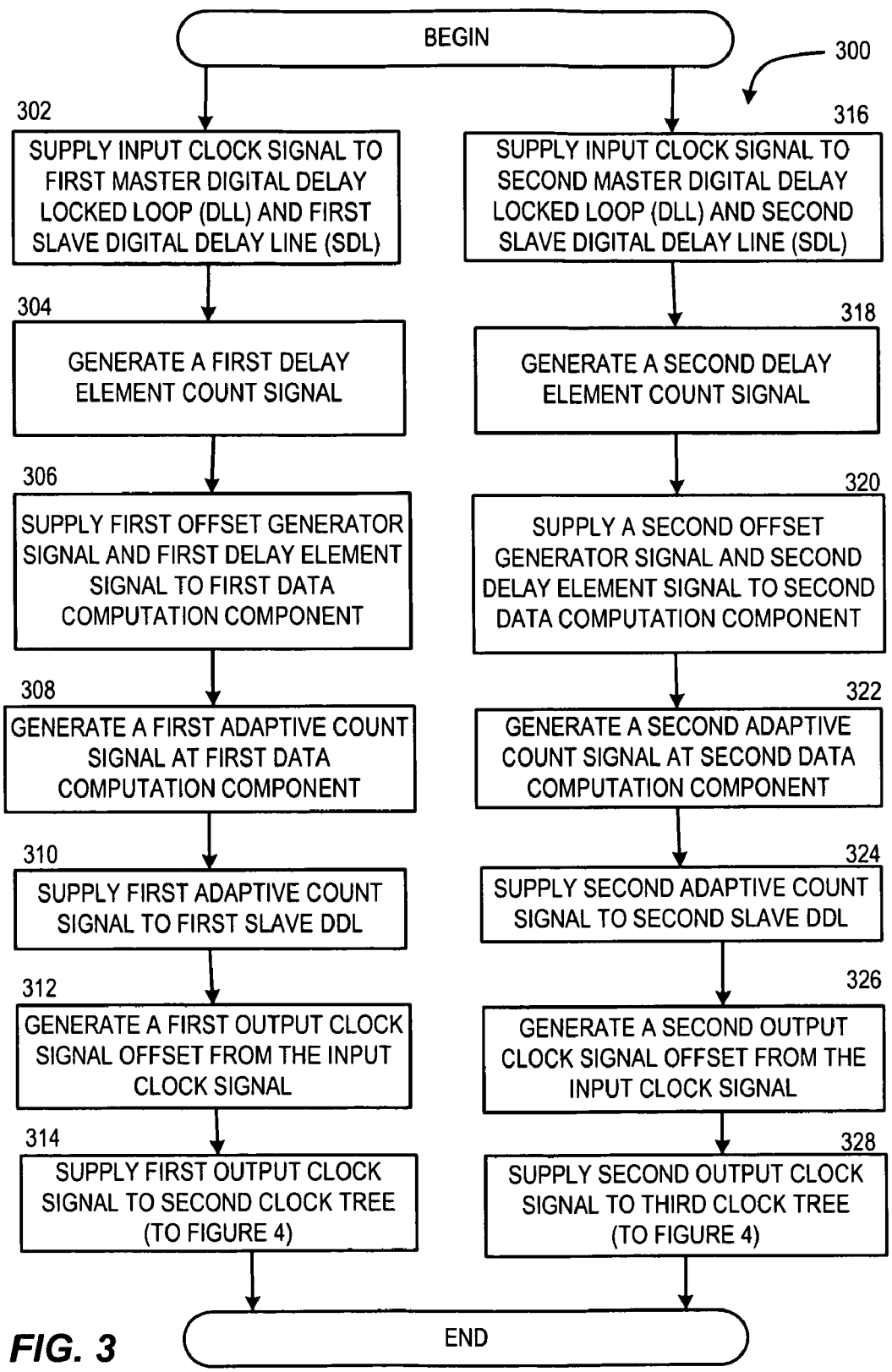
FIG. 3 is a logical flow diagram illustrating one routine of generating clock signals having desired offsets for mitigating radiation induced transient upset effects on digital semiconductor device data paths and clocks, according to embodiments described herein.

Turning now to FIG. 3, additional details will be provided regarding the embodiments presented herein for mitigating the effects of radiation induced circuit disturbances, such as SEUs, Data SETs and Clock SETs on digital semiconductor storage elements, data paths and clocks, respectively. In particular, FIG. 3 is a logical flow diagram illustrating one routine of generating clock signals having desired offsets for mitigating radiation induced transient upset effects on digital semiconductor device data paths and clocks, according to embodiments described herein. It should be appreciated that the logical operations described herein are implemented (1) as a sequence of computer implemented acts or program modules running on a computing system and/or (2) as interconnected machine logic circuits or circuit modules within the computing system. The implementation is a matter of choice dependent on the performance and other operating parameters of the computing system. Accordingly, the logical operations described herein are referred to variously as operations, structural devices, acts, or modules. These operations, structural devices, acts and modules may be implemented in software, in firmware, in special purpose digital logic, and any combination thereof. It should also be appreciated that more or fewer operations may be performed than shown in the figures and described herein. These operations may also be performed in parallel, or in a different order than those described herein.

FIG. 3 shows a logical flow diagram illustrating a routine 300 for generating a first output clock signal 220 and a second output clock signal 230 for providing to the triple voting register structure 104, so as to mitigate the effects of clock SETs under various PVT conditions. The adaptive temporal filter 102, described above in regard to FIG. 1 receives an input clock signal 210 and generates the first output signal 220 and the second output clock signal 230. Operations 302-314 describe the generation of the first output clock signal 220, while operations 316-328 describe the generation of the second output clock signal 230. It should be appreciated that these sets of operations may be performed simultaneously.

The generation of the first output clock signal 220 begins at operation 302, where the adaptive temporal filter 102 supplies the input clock signal 210 to the first DLL 110 via the reference input 111. The routine 300 then proceeds from operation 302 to operation 304, where upon receiving the input clock signal 210 at the first DLL, the first DLL 110 generates the first delay element count signal and supplies it to the first data computation component 118 at operation 304. As described above, the first delay element count signal represents the number of first master delay elements required to delay the input clock signal by one full period. From operation 304, the routine 300 proceeds to operation 306, where the offset signal generator 116 generates the first desired offset signal and supplies the first desired offset signal to the first data computation component 118. As described above, the first desired offset signal represents the first desired offset 202, which may be a target pulse width corresponding to the pulse widths of transient upsets for a given semiconductor technology commonly found in various conditions of a space environment. From operation 306, the routine 300 proceeds to operation 308, where the first data computation component 118 determines the first adaptive count signal, which represents the number of first slave delay elements to be used to delay the first output clock signal relative to the input clock signal by the first desired offset 202. From operation 308, the method proceeds to operation 310, where the first adaptive count signal is supplied to the tap input 122 of the first SDL 120. From operation 310, the routine 300 proceeds to operation 312, where the first SDL 120 generates a first output clock signal 220 delayed relative to the input clock signal 210 by the desired offset 202. From operation 312, the routine 300 proceeds to operation 314 where the adaptive temporal filter 102 supplies the first output clock signal 220 to the second clock tree 162 and the routine 300 ends with respect to the generation of the first output clock signal 220.

As discussed above, the routine 300 also describes generating the second output clock signal 230 at operations 316-328, which are similar to the operations from operations 302-314. At operation 316, the adaptive temporal filter 102 supplies the input clock signal 210 to the second DLL 130 via the reference input 131. The routine 300 then proceeds from operation 316 to operation 318, where upon receiving the input clock signal 210, the second DLL 130 generates the second delay element count signal and supplies it to the second data computation component 138. As described above, the second delay element count signal represents the number of second master delay elements required to delay the input clock signal by one full period.

From operation 318, the routine 300 proceeds to operation 320, where the second offset signal generator 136 generates the second desired offset signal and supplies the second desired offset signal to the second data computation component 138. As described above, the second desired offset signal represents the second desired offset 204, which may be twice the first desired offset 202. From operation 320, the routine 300 proceeds to operation 322, where the second data computation component 138 generates the second adaptive count signal, which represents the number of second slave delay elements to be used to delay the second output clock signal relative to the input clock signal by the second desired offset 204. From operation 322, the routine 300 proceeds to operation 324, where the second adaptive count signal is supplied to the second SDL 140. From operation 324, the routine 300 proceeds to operation 326, where the second SDL 140 generates the second output clock signal 230, which is delayed relative to the input clock signal 210 by the second desired offset 204. From operation 326, the routine 300 proceeds to operation 328, where the adaptive temporal filter 102 supplies the second output clock signal 230 to the third clock tree 164.

Figure 4:
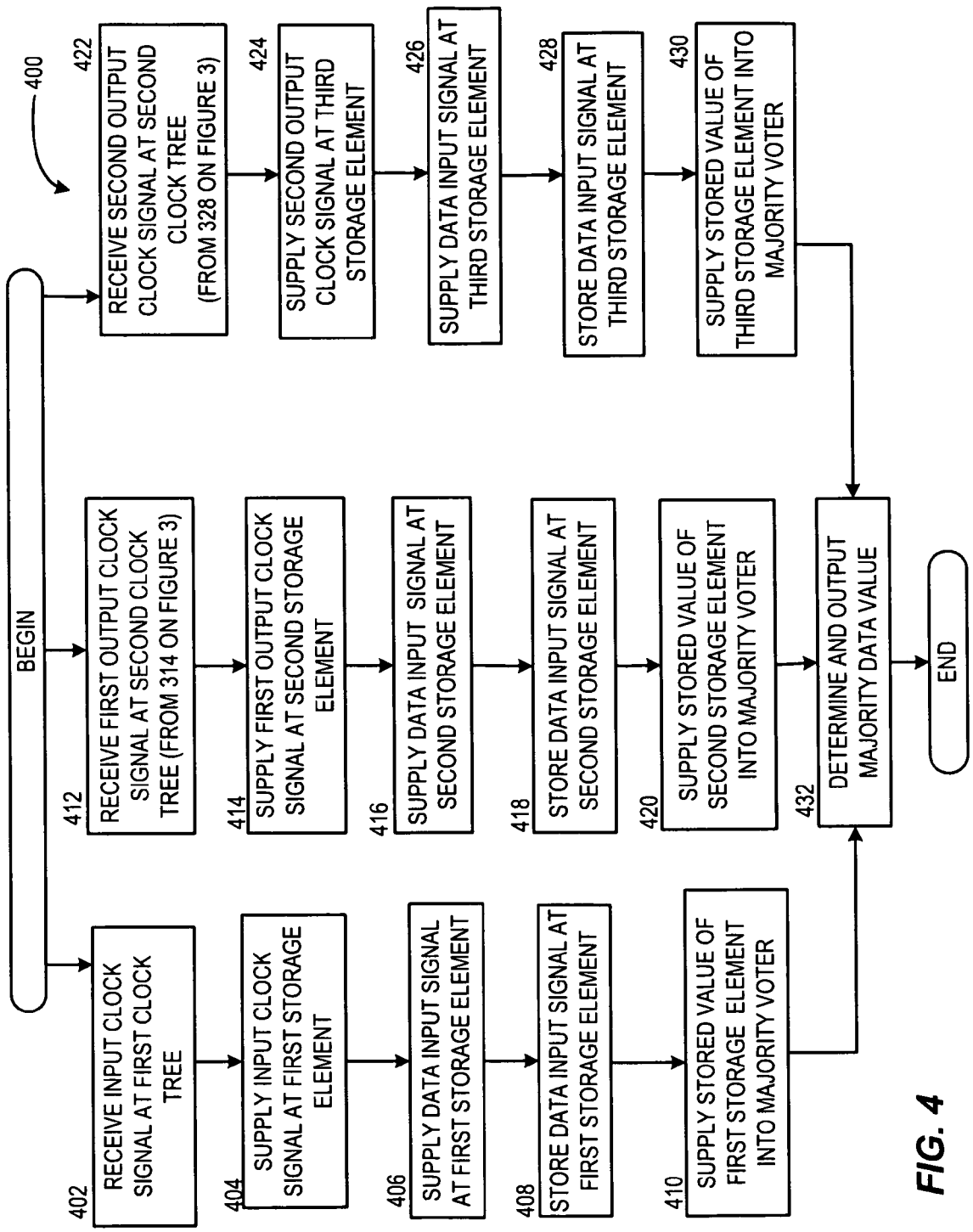
FIG. 4 is a logical flow diagram illustrating one routine of utilizing three independent clock signals and a triple voting register structure for mitigating radiation induced transient upset effects on digital semiconductor device data paths and clocks, according to embodiments described herein.

Referring now to FIG. 4, a logical flow diagram illustrating a routine 400 for supplying three independent clock signals into the triple voting register structure 104 for mitigating radiation induced transient upset effects on digital semiconductor device data paths is shown. The routine 400 describes storing data values at each of the three storage elements 172, 174 and 176 of the triple voting register structure 104. The first set of operations (operations 402-410) describe how a data value corresponding to the data input signal 170 is stored in the first storage element 172, the second set of operations (operations 412-420) describe how the data value is stored in the second storage element 174, and the third set of operations (operations 422-430) describe how the data value is stored in the third storage element 176, respectively. It should be appreciated that the first, second and third set of operations may occur simultaneously or based on their respective clock signals, except that the data value is only stored in any one of the respective storage elements at any given time.

Beginning with the first set of operations, at operation 402, the input clock signal 210 is supplied to the first clock tree 160 from the adaptive temporal filter 102. From operation 402, the routine 400 proceeds to operation 404, where the first clock tree 160 supplies the input clock signal 210 to the first storage element 172. From operation 404, the routine 400 proceeds to operation 406, where the data input signal 170 is supplied to the first storage element 172. In various embodiments of the present disclosure, the data input signal 170 may be continuously supplied to the first storage element 172, but the data value may be stored in the first storage element 172 only once per full period of the input clock signal 210. From operation 406, the routine 400 proceeds to operation 408, where the data value represented by the data input signal 170 is stored at the first storage element 172, when the input clock signal 210 approaches its trigger point, such as the rising edge of the input clock signal 210. In alternative embodiments, the data value may be stored at any pre-defined trigger point of the input clock signal, as long as the first storage element 172 stores the data value only once per full period of the input clock signal 210. After storing the data value at the first storage element 172 at operation 408, the routine 400 proceeds to operation 410, where the stored data value is supplied to the majority voter 178. From operation 410, the routine 400 proceeds to operation 432 and continues as described in further detail below.

Moving towards the second set of operations of routine 400, at operation 412, the second clock tree 162 receives the first output clock signal 220 from the adaptive temporal filter 102, which supplies the first output clock signal 220 at the second clock tree 162 in operation 314 of FIG. 3. From operation 412, the routine 400 proceeds to operation 414, where the first output clock signal 220 is supplied to the second storage element 174. As described above, the first output clock signal 220 is delayed relative to the input clock signal 210 by the first desired offset 202. From operation 414, the routine 400 proceeds to operation 416, where the data input signal 170 is supplied to the second storage element 174. From operation 416, the routine 400 proceeds to operation 418, where the data value represented by the data input signal 170 is only stored when the first output clock signal 220 approaches its trigger point, such as the rising edge of the first output clock signal 220. From operation 418, the routine 400 proceeds to operation 420, where the data value stored in the second storage element 174 is supplied to the majority voter 178. From operation 420, the method proceeds to operation 432 and continues as described in further detail below.

Moving towards the third set of operations of routine 400, at operation 422, the third clock tree 164 receives the second output clock signal 230 from the adaptive temporal filter 102, which supplies the second output clock signal 230 to the third clock tree 164 in operation 328 of FIG. 3. As described above, the second output clock signal 230 is delayed relative to the input clock signal 210 by the second desired offset 204. From operation 422, the routine 400 proceeds to operation 424 where the second output clock signal 230 is supplied to the third storage element 176. From operation 424, the routine 400 proceeds to operation 426, where the data input signal is supplied to the third storage element 176. From operation 426, the routine 400 proceeds to operation 428, where the data value is stored in the third storage element 176 when the second output clock signal 230 approaches its trigger point, such as its rising edge. From operation 428, the routine 400 proceeds to operation 430, where the data value stored in the third storage element is supplied to the majority voter 178. From operation 430, the method proceeds to operation 432.

At operation 432, the majority voter 178 determines the majority data value and outputs the majority data value. As discussed earlier, in various embodiments of the present disclosure, the majority data value may be the data value stored in at least two of the three storage elements. Also, because the three storage elements 172, 174, 176 may only store the data value when the associated clock signals approach their respective trigger points, as long as an upset that affects the data input signal does not have a pulse width larger than the desired offset, only one of the data values stored in one of the three storage elements 172, 174, 176 may be corrupted.

The various embodiments of the present disclosure described herein may be used to mitigate the adverse effects of radiation induced single event effects for single event upsets, the Data SET and the Clock SET. The present disclosure utilizes digital DLLs and SDLs to generate and provide programmable, precise clock signals that are unaffected by variations in PVT conditions. These clock signals are then supplied to a triple voting register structure. In the present disclosure, DLLs and SDLs generate clock signals that are precisely offset relative to each other and that remain unaffected to variations in PVT conditions. This may eliminate the need to overcompensate in a fixed temporal filtering approach for variations in PVT conditions which can be significant for traditional semiconductor technologies. This may be desirable because overcompensating in a fixed filter approach for variations in PVT conditions translates into reduced operational performance.

In addition, the present disclosure describes utilizing independent clock trees to provide independent clock signals to each of the storage elements of the triple voting register structure, which may allow the triple voting register structure to be unaffected by Clock SETs that may adversely affect any one of the clock signal generation paths and corresponding clock signals. Moreover, by utilizing multiple master DLLs and SDLs, a single upset may only affect one of the three clock signals. As described above, by using the adaptive temporal filter in conjunction with the triple voting register structure, the voter majority output remains valid, despite an upset that may affect any one component of the adaptive temporal filter system. Therefore, the use of the three independent, offset clock signals controlling the triple voting register structure mitigates against SEUs, Data SETs, and Clock SETs.

The subject matter described above is provided by way of illustration only and should not be construed as limiting. Various modifications and changes may be made to the subject matter described herein without following the example embodiments and applications illustrated and described, and without departing from the true spirit and scope of the present disclosure, which is set forth in the following claims.

What is claimed is:

1. A method of mitigating radiation induced transient upset effects on digital semiconductor device data paths and clocks, comprising:
    receiving an input clock signal at an adaptive temporal filter comprising a master delay line and a slave delay line;
    supplying the input clock signal to the master delay line comprising a plurality of master delay elements, and to the slave delay line comprising a plurality of slave delay elements;
    creating a variable delay element count signal representing a number of master delay elements of the plurality of master delay elements used to delay the input clock signal by one full period at the master delay line;
    creating an adaptive count signal representing a number of slave delay elements of the plurality of slave delay elements to be used to delay the input clock signal by a desired offset using the variable delay element count signal from the master delay line and a desired offset signal representing the desired offset;
    receiving the adaptive count signal and the input clock signal at the slave delay line;
    delaying the input clock signal by using the number of slave delay elements represented by the adaptive count signal to create an output clock signal; and
    outputting the output clock signal, wherein the output clock signal is delayed relative to the input clock signal by the desired offset.

2. The method of claim 1, wherein the creating the adaptive count signal further comprises multiplying the number of master delay elements used to delay the input clock signal by one full period and the desired offset.

3. The method of claim 1, further comprising setting the desired offset signal to represent a maximum pulse width of radiation induced transient upset effects to be filtered.

4. The method of claim 1, further comprising adjusting the variable delay element count signal under different process, voltage and temperature conditions.

5. The method of claim 1, wherein creating the adaptive count signal, further comprises:
    supplying the variable delay element count signal and the desired offset signal to a data computation component;
    combining the variable delay element count signal and the desired offset signal to generate the adaptive count signal.

6. An adaptive temporal filter system, comprising:
    an adaptive temporal filter comprising
    a first master delay line and a first slave delay line configured to receive an input clock signal and create a first output clock signal that is delayed relative to the input clock signal by a first desired offset, and
    a second master delay line and a second slave delay line configured to receive the input clock signal and to create a second output clock signal that is delayed relative to the input clock signal by a second desired offset; and
    a triple voting register structure configured
        to receive the input clock signal, the first output clock signal and the second output clock signal from the adaptive temporal filter,
        to receive a data input signal representing a data value to be stored in the triple voting register structure,
        to store the data value in the triple voting register structure once every full period of the input clock signal, the first output clock signal and the second output clock signal, and
        to output the stored data value from a majority voter.

7. The adaptive temporal system of claim 6, further comprising:
    a first clock tree configured
        to receive the input clock signal from the adaptive temporal filter, and
        to supply the input clock signal to a first storage element of the triple voting register;
    a second clock tree configured
        to receive a first output clock signal from the first slave delay line, and
        to supply the first output clock signal to a second storage element of the triple voting register; and
    a third clock tree configured
        to receive a second output clock signal from the second slave delay line, and
        to supply the second output clock signal to a third storage element of the triple voting register.

8. The adaptive temporal filter system of claim 7, wherein the adaptive temporal filter further comprises a multiplexer configured to selectively supply the input clock signal to the first clock tree, the second clock tree and the third clock tree.

9. The adaptive temporal filter system of claim 7, wherein the first storage element, the second storage element and the third storage element are configured to store the data input signal only during a rising edge of the input clock signal, the first output clock signal and the second output clock signal, respectively.

10. The adaptive temporal filter system of claim 6, wherein the desired offset is programmed to a maximum upset pulse width of radiation induced transient upset effects to be filtered.

11. The adaptive temporal filter system of claim 6,
wherein the first master delay line comprises a plurality of master delay elements and the first slave delay line comprises a plurality of slave delay elements,
wherein each master delay element and each slave delay element possesses a variable delay length for varying process, voltage and temperature conditions.

12. The adaptive temporal filter system of claim 11,
wherein the first master delay line is configured
to receive the input clock signal,
to determine a number of master delay elements used to delay the input clock signal by one full period, and
to output a variable delay element count signal representing the number of master delay elements used to delay the input clock signal by one full period;

wherein the adaptive temporal filter further comprises a first data computation component configured
to receive the variable delay element count signal from the master delay line,
to receive a desired offset signal representing a desired offset,
to determine a number of slave delay elements to be used to delay the input clock signal by the desired offset, and
to output an adaptive count signal representing the number of slave delay elements to be used to delay the input clock signal by the desired offset; and wherein the first slave delay line configured
to receive the adaptive count signal,
to receive the input clock signal,
to delay the input clock signal by the desired offset by using the number of slave delay elements represented by the adaptive count signal to create the output clock signal, and
to output the output clock signal that is delayed relative to the input clock signal by the desired offset.

* * * * *